United States Patent [19]

Kahan

[11] Patent Number: 4,899,149

[45] Date of Patent: Feb. 6, 1990

[54] METHOD OF AND APPARATUS FOR DECODING HUFFMAN OR VARIABLE-LENGTH COEES

[76] Inventor: Gary Kahan, 444 Neptune Ave., Brooklyn, N.Y. 11224

[21] Appl. No.: 834,636

[22] Filed: Feb. 28, 1986

[51] Int. Cl.⁴ ............................................. H03M 7/42
[52] U.S. Cl. ....................................... 341/67; 341/51; 341/107
[58] Field of Search ................ 340/347 DD; 358/261, 358/260, 135; 341/51, 67, 95, 79, 65, 106, 107

[56] References Cited

U.S. PATENT DOCUMENTS

| | | | |
|---|---|---|---|
| 3,701,111 | 10/1972 | Cocke et al. | 340/172.5 |
| 3,717,851 | 2/1973 | Cocke et al. | 340/172.5 |
| 3,918,047 | 11/1975 | Denes | 341/67 |
| 4,075,622 | 2/1978 | Lawrence et al. | 341/67 |
| 4,118,773 | 10/1978 | Raguin et al. | 364/200 |
| 4,168,513 | 9/1979 | Hains et al. | 340/347 DD X |
| 4,396,906 | 8/1983 | Weaver | 340/347 DD |
| 4,558,302 | 12/1985 | Welch | 341/51 |

Primary Examiner—William M. Shoop, Jr.
Assistant Examiner—Brian K. Young
Attorney, Agent, or Firm—Charles E. Temko

[57] ABSTRACT

Novel decoding method and apparatus are disclosed for Huffman or variable-length codes. According to the invention, variable-length code-words are divided into two parts, a variable-length prefix part and the remainder of the code-word which is of fixed-length or approximately so. The variable-length part consists of a series of 1's terminated by a single 0 bit. The number of 1's preceeding the first 0 bit indicates the prefix of a particualr code-word. The code-words are arranged so that the ones with the same prefix have the same length, or as close as possible. With this novel codification, decoding the variable-length code-words is accomplished in two simple steps. In the first step the decoder determines the position of the first 0 bit in the present code-word, using this information to specify a section of the main memory. The second step is to index into that memory section using the remaining part of that code-word, and this retrieve the fixed length representation.

13 Claims, 6 Drawing Sheets

| DATA ITEM | APPROXIMATE PROBABILITY | RESULTING CODE WORD |
|---|---|---|
| a | 1/4 | 00 |
| b | 1/4 | 01 |
| c | 1/8 | 100 |
| d | 1/16 | 1010 |
| e | 1/16 | 1011 |
| f | 1/16 | 1100 |
| g | 1/32 | 11010 |
| h | 1/32 | 11011 |
| i | 1/32 | 11100 |
| j | 1/32 | 11101 |
| k | 1/32 | 11110 |
| l | 1/32 | 11111 |

FIG. 3.

| | DATA ITEM | REMAINING LENGTH |
|---|---|---|
| 0000 | a | 1 |
| 0001 | a | 1 |
| 0010 | b | 1 |
| 0011 | b | 1 |
| 0100 | c | 1 |
| 0101 | c | 1 |
| 0110 | d | 2 |
| 0111 | e | 2 |
| 1000 | f | 1 |
| 1001 | f | 1 |
| 1010 | g | 2 |
| 1011 | h | 2 |
| 1100 | i | 2 |
| 1101 | j | 2 |
| 1110 | k | 2 |
| 1111 | l | 2 |

| DATA ITEM | APPROXIMATE PROBABILITY | INITIAL CODE WORD | FINAL CODE WORD |
|---|---|---|---|
| a | 1/2 | 0 | 0 |
| b | 1/8 | 100 | 100 |
| c | 1/8 | 101 | 101 |
| d | 1/32 | 11000 | 11100 |
| e | 1/32 | 11001 | 11101 |
| f | 1/32 | 11010 | 11110 |
| g | 1/64 | 110110 | 110000 |
| h | 1/64 | 110111 | 110001 |
| i | 1/64 | 111000 | 110010 |
| j | 1/64 | 111001 | 110011 |
| k | 1/64 | 111010 | 110100 |
| l | 1/64 | 111011 | 110101 |
| m | 1/64 | 111100 | 110110 |
| n | 1/64 | 111101 | 110111 |
| o | 1/64 | 111110 | 111110 |
| p | 1/64 | 111111 | 111111 |

| | BASE ADDRESS | REMAINING LENGTH |
|---|---|---|
| 0 | 1 1 1 0 | 0 |
| 1 | X 1 0 0 | 1 |
| 2 | X X X 0 | 3 |
| 3 | X 1 0 1 | 1 |
| 4 | 1 1 1 1 | 0 |
| 5 | X 1 1 0 | 1 |

FIG. 6B.

| | DATA ITEM |
|---|---|
| 0 | g |
| 1 | h |
| 2 | i |
| 3 | j |
| 4 | k |
| 5 | l |
| 6 | m |
| 7 | n |
| 8 | b |
| 9 | c |
| 10 | d |
| 11 | e |
| 12 | o |
| 13 | p |
| 14 | a |
| 15 | f |

METHOD OF AND APPARATUS FOR DECODING HUFFMAN OR VARIABLE-LENGTH COEES

BACKGROUND OF THE INVENTION

The compaction of data while it is being transmitted or held in long-term storage may be accomplished by variable-length coding. In this type of coding scheme, bit strings of fixed length are encoded into bit strings of variable-length, with the more frequently occurring bit strings or words being represented by the shorter-length code-words. If the assignment of variable-length code-words is judiciously done, their average length will be much even though many of the variable-length code words are much longer than the fixed-length code-words.

Huffman codes are minimum reduncancy variable-length codes that have the prefix-free properly, that is none of the code-words can form the beginning of a longer code-word. The construction of Huffman codes is described in an article by David A. Huffman entitled "A Method for the Construction of Minimum Redundancy Codes", in the proceedings of the I. R. E., Vol. 40, pp. 1098–1101, 1952. Huffman codes are usually preferred over other variable-length codes due to their straight forward construction and their optimum expected (average) code-word length.

Although variable-length coding is useful for reducing the facilities and time required for the transmission and storage of data, the compacted data cannot be utilized by a data processor computer in this form, and must be decoded back to a fixed-length code format. The processing costs involved in decoding Huffman codes have isolated them mostly to the theoretical domain. Decoding schemes have been proposed but they have deficiencies which make them unsuitable for general use. They either require too much time and/or memory for the decoding process or are strictly limited to particular probability distributions. Some require special hardware that is not ordinarily available in conventional data processors. Specifically, U.S. Pat. No. 4,396,906 discloses a method that can only be used on Huffman codes whose probability distributions produce degenerate decoding trees. Except for the degenerate case, the invention will not work without altering the optimum Huffman code. U.S. Pat. Nos. 3,701,111 and 3,717,851 present similar problems. No practical hardware means are presently available to decode general Huffman codes in a quick and efficient manner.

There is a great need at the present time for a convenient and practical way to decode variable-length codes with conventional hardware or data processors and without losing a significant amount of time in processing such data. If the decoding times can be decreased, it will greatly enhance the utility of Huffman or variable-length coding and make its savings available to designers of data processing and data communication systems.

SUMMARY OF THE INVENTION AND OBJECTS

The primary object of this invention is to provide an improved method for decoding variable-length code-words into fixed-length code-words.

It is a further object of the invention to be able to decode long code-words and thus use Huffman codes, or as close to Huffman codes as possible, in order to achieve maximum compression for all probability distributions.

It is another object of the invention to provide such a decoding method that will increase the information handling rate by decoding the variable-length code-words in a expeditious manner. All code-words, short or long, will be able to be decoded in basically the same amount of time, roughly the time needed for one main memory access. Such a decoding system will improve the buffer statistics of the code-words and allow decoding-times that are dramatically less than was previously thought possible.

It is yet another object of the invention to provide such a decoding method in an economical manner with a minimum of complexity, logic, and computing capability. The decoding system will consist only of simple circuit elements, including a very reasonably sized conventional memory.

According to the invention, the variable-length code-words are divided into two parts, a variable-length prefix part and the remainder of the code-word which is of fixed-length or approximately so. The variable-length part consists of a series of 1's terminated by a single 0 bit. The number of 1's preceeding the first 0 bit indicates the prefix of a particular code-word. The code-words are arranged so that the ones with the same prefix have the same length, or as close as possible. With this novel codification, decoding the variable-length code-words is accomplished in two simple steps. In the first step the decoder determines the position of the first 0 bit in the present code-word, using this information to specify a section of the main memory. The second step is to index into that memory section using the remaining part of the code-word, and thus retrieve the fixed-length representation.

The above description is the basic invention, although in practice, provisions are made for the singular case when the prefix consists of all 1's equal in length to the longest regular prefix. Furthermore, there are several variations of the basic invention that can be chosen depending on such factors as cost, probability distribution, degree of compression required, and speed in decoding. Firstly, the hardware used to determine the first 0 bit in a code-word can be a counter that counts the preceeding 1's or it can be bit logic that operates directly on the number of bits contained in the longest prefix. Secondly, after determining the position of the first 0 bit, the number of bits used to index into memory can be prefix dependent or the same for all prefixes. Lastly, the actual length of the code-words for any particular prefix could be identical or they can be different even for the same prefix.

BRIEF DESCRIPTION OF THE DRAWINGS

The invention will be better understood from the following description when considered with the accompanying drawings.

FIG. 1A is a binary tree depicting the code-words for a set of data-items, while

FIGS. 4A and 4B are binary trees depicting equivalent code-word sets for a given set of data-items, while

FIGS. 7 and 8 show decoders that use the same number of bits to index into main memory for all code-word prefixes, but allow for different code-word lengths for code-words of the same prefix. The decoders of FIGS. 10 and 11 can index into the main memory using different numbers of bits for different prefixes, but all code-words with the same prefix must have the same length.

DETAILED DESCRIPTION OF PREFERRED EMBODIMENTS

As described above the novel decoding scheme involves two basic steps. The first step is to determine the first 0 bit in the code-word to specify a memory section; the second step is to index into the memory section using the rest of the code-word and thus retrieve the data-item. The different ways one can index into memory and what must be stored in that memory yields different variations of the novel decoding scheme. The number of bits used to index into memory can be prefix dependent (dependent on the position of the first 0 bit) or the same for all prefixes (and thus for all code-words). Furthermore, the actual length of the code-words (and thus the remaining part excluding the prefix), could be identical for a particular prefix or they can be different even for the same prefix. These choices yield the four variations of the decoding method that can be used.

Figure 1A:
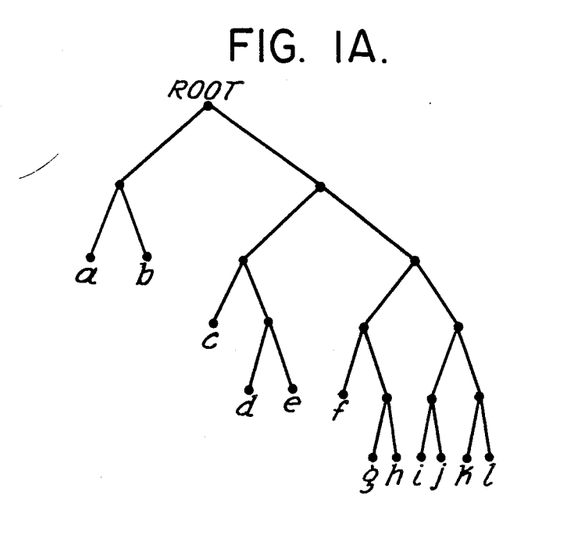

FIGS. 1A–3 illustrate the situation when we index into memory with the same number of bits for all prefixes, but the code-words of each prefix are not necessarily of the same length. A set of data-items, their probability of occurence, and their corresponding code-words are shown in table form in FIG. 2. The code-words are constructed using the Huffman coding algorithm and are therefore optimum in the sense of having the shortest expected code-word length for the given probability distribution. It is advisable to use a Huffman code, or one as close to it as possible in order to achieve the maximum data compaction possible. The code-words are arranged by probability rank in both FIG. 2 and FIG. 1A to reduce the amount of memory required, as will be seen later. FIG. 1A is merely a binary-tree representation of the data items and code-words shown in FIG. 2. In FIG. 1A right branches represents 1's in the respective code-word while left branches represents 0's. To find the binary form of the code-word for a particular data-item, one starts at the root of the tree, following the proper branches until the desired data-item is reached. The type of branches taken (right or left), indicate the binary form of the corresponding code-word. As noted above, the first step in the decoding method is to determine the first 0 bit or the prefix, the prefix being the first 0 bit plus all the preceeding 1's (except for the longest prefix consisting of all 1's). Hence, we must decide on the set of prefixes that will achieve the minimum memory requirements. Looking closely at FIG. 1A, one sees the remainder of any code-word (the remaining part following the prefix) is at most two bits. The length of the longest prefix should be the length of the longest remainder subtracted from the length of the longest code-word. In this example that is 5bits−2 bits=3 bits long. Therefore, the obvious choice of prefixes are 0, 10, 110, and 111. Any longer prefixes would only increase the memory requirements since each additional prefix will require 4 additional entries in the decoding table. The special case prefix of all 1's will always share its longest length with a regular prefix but its detecting can easily be accomplished in hardware.

Figure 1B:
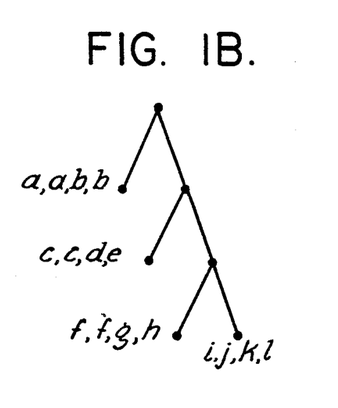
FIG. 1B is a tree illustrating the decoding method for retrieving said data-items given said code-words.
Figure 2:
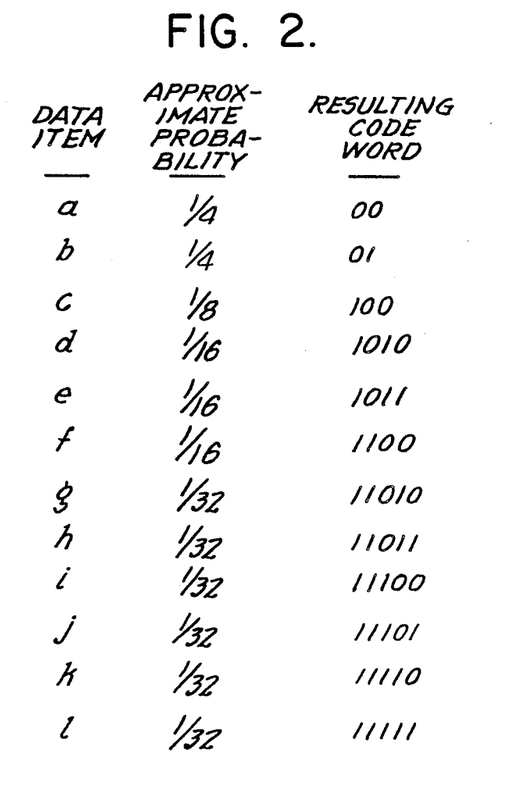
FIG. 2 is a table showing the probability distribution and the code-words in binary form of the data-items seen in FIG. 1A.
Figure 3:
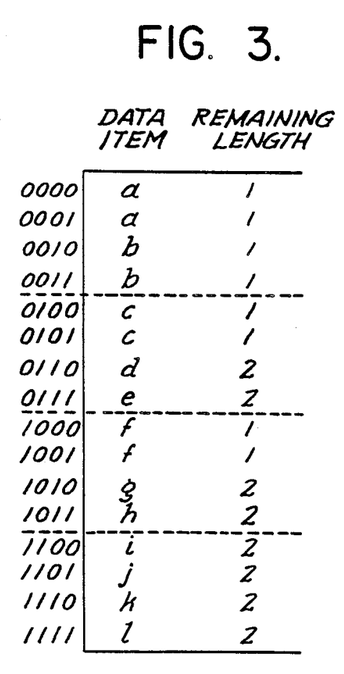
FIG. 3 is a representation of the decoding table used in accordance with the decoding scheme illustrated in FIG. 1B.

FIG. 1B represents the decoding method, in tree form, applied to the present example. The tree is entered from the top and the branches are followed using the bits of a code-word until a leaf is reached that corresponds to one of the four prefixes (0, 10, 110, 111). The following two bits of the input stream are then used to index into memory to retrieve the proper data-item. The leaves of the tree indicate the contents of the decoding table as shown in FIG. 3. Each code-word prefix corresponds to a certain portion of the decoding table delineated by the dotted lines. To retrieve an entry from the table, the first two bits of the address are indicated by the prefix (prefix 0 for 00, 10 for 01, 110 for 10, and 111 for 11), while the last two bits are taken off the input line following the code-word prefix. Each table entry contains not only the corresponding data-item but also a remaining length field. The field indicates the proper length of the remaining part of the code-word (excluding the prefix), and allows the proper shifting of the input bit stream for decoding of the next code-word.

Another variation of the decoding scheme is when we index into memory with the same number of bits for all prefixes, and code-words of the same prefix are of the same length. This decoding method is for the most part similar to the one described in FIGS. 1A–3; after the prefix is determined, we index into memory with a fixed number of bits regardless of the prefix. However, the length of the remainder of the code-word is always the same, thus eliminating the need to have a remaining length field in the decoding table and thus saving memory. Consequently, the code might have to be modified a little from the standard Huffman code. All prefixes must form the same number of code-words, a number that is a power of 2 (except for the special case all 1's prefix). With this variation, decoding is simpler and more time efficient since the number of bits used to index into memory will always be removed from the input stream and no special shifting operations would be required. Nevertheless, the gains in speed and memory reduction come only at the cost of a loss in data compression due to a non-optimal code.

The situation when the number of bits used index into memory is prefix dependent, but the code-words of any particular prefix are of the same length is shown in FIGS. 4A–6B. The table of FIG. 5 lists a set of data-items, their probability of occurence, and two equivalent code-word sets. The initial code-word set is constructed using the Huffman coding algorithm and is illustrated in tree form in FIG. 4A. By arranging the data-items by probability rank from left to right in a binary tree the resulting code-words are ideally suited for the cases when we index into memory with the same number of bits for all prefixes. However, when the number of bits we index with can be different for different prefixes, rearranging the code-words so that each prefix forms code-words of the same length will prove advantageous. FIG. 4B arranges the data-items in just such a manner and the resulting code-words are listed in the final code-word set of FIG. 5. This particular decoding method variation is useful when the probability distribution of the data-items exhibit the characteristics seen in FIG. 4A and 4B. When the data-items are arranged by probability rank the remainder of the code-words varies too much (from 0 to 3 bits) for different prefixes, making the decoding scheme of FIGS. 1A–3 very memory inefficient. Furthermore, the data-items can be rearranged on their respective tree levels, so that code-words of the same prefix have the same length (although this may not always be the case). This arrangement allows the number of bits used to index into memory for a particular prefix to also indicate the length of the remainder of all code-words for that prefix. It must be pointed out that rearranging the code-words in FIG. 4A to those in FIG. 4B does not change the length of any of the code-words, and thus the optimum characteristics of a Huffman code (minimum expected code-word length) is maintained. Looking closely at FIG. 4B, the choice of prefixes becomes apparent: 0, 10, 110, 1110, 11110, and 11111. We could add another prefix to divide data-items o and p between two prefixes, but this would not simplify anything.

Figure 4A:
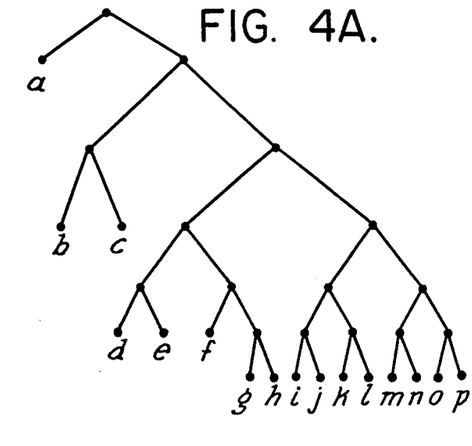
Figure 4B:
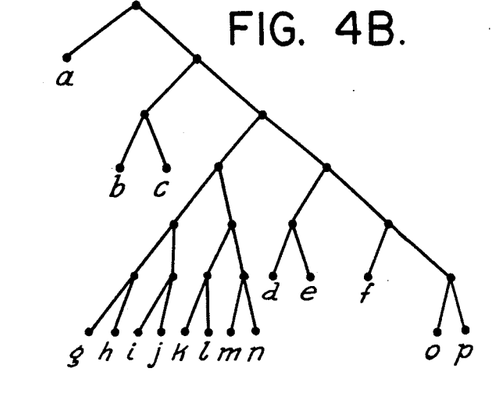
Figure 4C:
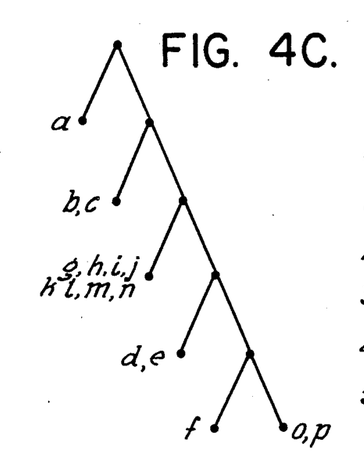
FIG. 4C is a tree illustrating the decoding method for retrieving said data-items given the code-word set in FIG. 4B.
Figure 5:
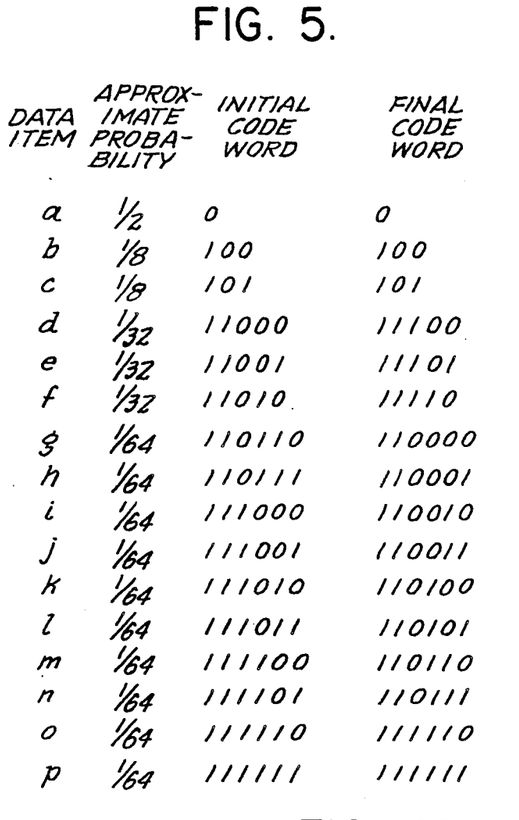
FIG. 5 is a table showing the probability distribution and the two equivalent code-words sets in binary form of the data-items seen in FIGS. 4A and 4B.
Figure 6A:
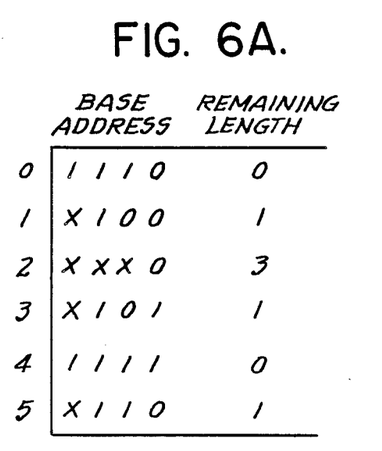
FIGS. 6A and 6B are representations of the decoding tables used in accordance with the decoding scheme illustrated in FIG. 4C.
Figure 6B:
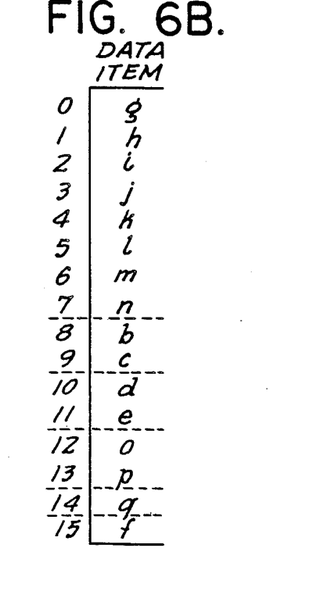

The decoding method for this variation is represented in tree form in FIG. 4C. Entering the tree from the top, one uses the bits of the input stream to determine which branches to take and which of the six prefixes, corresponding to the six leaves, is being formed. Depending on which leaf is reached, 0, 1, or 3 bits are then removed from the input stream and used to index into memory to retrieve the proper data-item. The decoding tables shown in FIGS. 6A and 6B can be derived from the leaves of the decoding tree. FIG. 6B is the decoding table from which all the data-items are retrieved. The data-items are grouped by their corresponding code-word prefixes, each group being delineated by the dotted lines. The groups are arranged by the number of data-items in each group, with the larger groups preceding the smaller ones. FIG. 6A lists the base addresses of the groups in the decoding table of FIG. 6B with the remaining length of the code-words for each of the code-word prefixes, or data-item groups. Note, each entry in FIG. 6A stands for a code-word prefix (prefix 0 for 1, 10 for 1, 110 for 2, 1110 for 3, 11110 for 4, and 11111 for 5). The remaining length field is easily deduced by subtracting the prefix length from the length of the code-words having said prefix. The base address field merely the address in the table of FIG. 6B of the first data-item in a group, right-shifted the number of bits equal to the remaining length field, (an X stands for a don't care bit). With the decoding tables arranged in this manner, the decoding process becomes straight forward. After the code-word prefix is determined, its corresponding entry in the table of FIG. 6A is retrieved. A number of bits equal to the remaining length field is removed from the input stream and left-shifted onto the base address field. The result is the address of the appropriate data-item in the table of FIG. 6B.

The final variation of the novel decoding system exists when the number of bits used to index into the main memory is prefix dependent, and the code-words of each prefix are not necessarily of the same length. This decoding scheme is essentially similar to the scheme of FIGS. 4A–6B. The decoding tables of FIGS. 6A and 6B would remain unchanged except that the remaining length field of the table in FIG. 6A would indicate the remaining length of the longest code-word of each group and FIG. 6B's table would have another field to indicate the actual remaining code-word length of each code-word. There would be some duplication of entries in the decoding table of FIG. 6B as in FIG. 3, since not all code-words of the same prefix would have the same length. The decoding process would be substantially the same as the previous method; the code-word prefix is determined, its corresponding entry in the first decoding table is retrieved, a number of bits indicated by one filed of this table is left-shifted onto the other filed to produce an address in a second decoding table, and finally one field of this second table would contain the data-item while the other would indicate the number of bits to be removed from the input stream. Usually this final version of the novel decoding method need not be used but rather one of the other three simpler methods would do. If, however, code-words of the same prefix differ widely in length or changing the length of the code-words would significantly affect the expected code-word length, so as to prohibit the use of one of the other three versions, then this fourth version would be suitable. It can accommodate all Huffman codes with code-words ordered by probability rank (and thus maintain the minimum expected code-word length) while limiting the number of entries in the main decoding table to less than twice the number of data-items.

Each of the four decoding schemes described above can be realized in hardware in two basic ways, depending on how the code-word prefix is determined. We can either use a counter to count the number of 1's preceding the first 0 bit in each code-word or use bit logic to work directly upon a number of leading bits of each code-word equal to the longest prefix. Hence, the four decoding method variations become eight hardware embodiments of the present invention. In FIGS. 7–11, where certain embodiments are illustrated, a few notations are used that need to be explained. The letter M represents the length of the longest code-word prefix. $\lceil \log M + 1 \rceil$ is the smallest integer greater than or equal to the binary logarithm of M plus 1; this expression refers to the number of bits needed to represent all the prefixes. The letter N denotes the length of the longest remainder of any code-word, (excluding the prefix).

Figure 7:
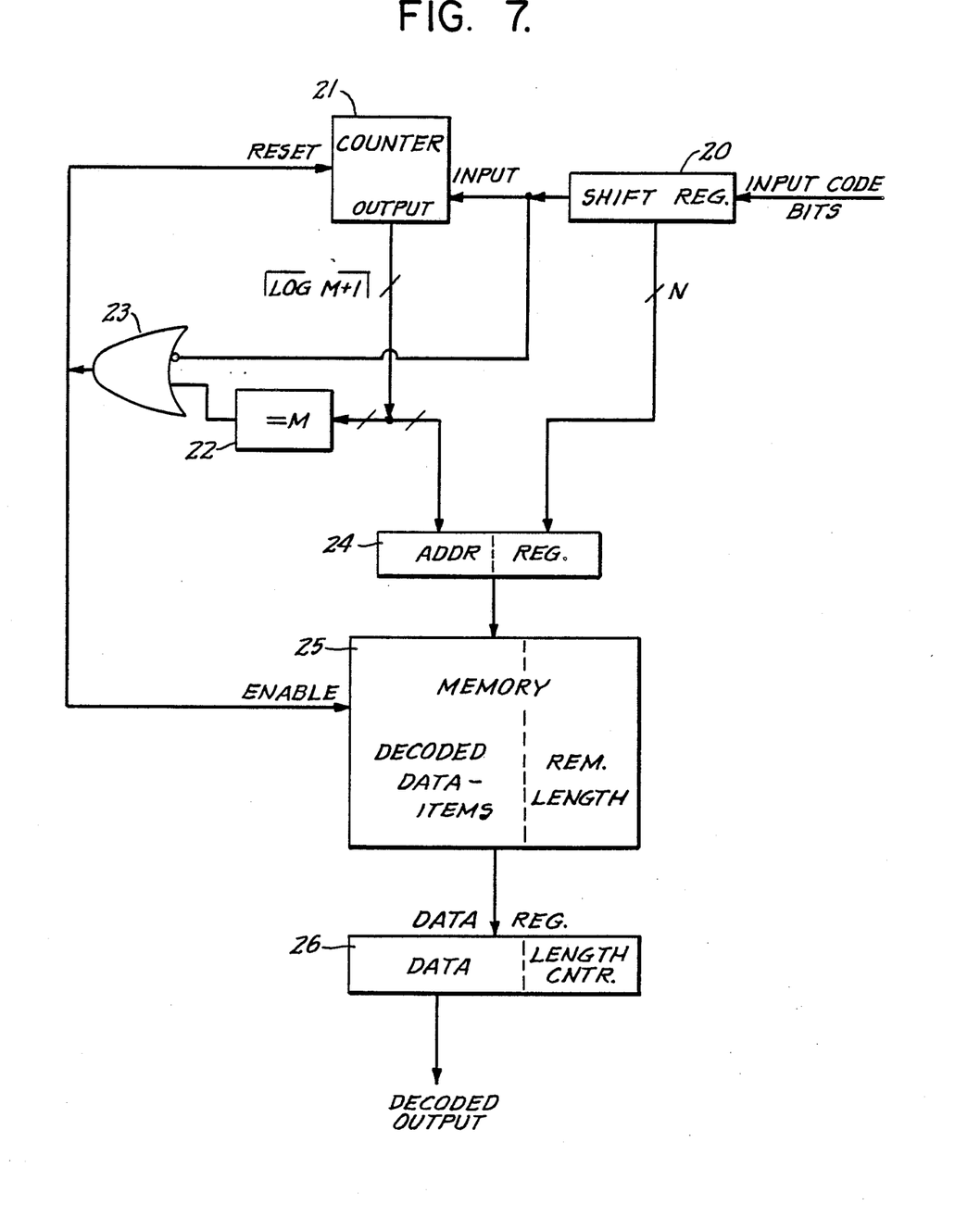
FIGS. 7, 8, 10, and 11 are block diagrams showing details of four embodiments of a novel decoding system employing the present invention. The decoders in FIGS. 7 and 10 employ counters to determine the position of the first 0 bit in a code-word, while those in FIGS. 8 and 11 use bit logic.

FIG. 7 illustrates the hardware embodiment of the decoding method wherein a counter is used to determine the code-word prefix, the same number of bits are used to index into memory for all prefixes, and code-words of the same prefix may be of different lengths. Input code bits are shifted into one end of shift register 20 which is N bits wide; the contents of the shift register are always latched onto the N low order bits of address register 24. The input bits pass through and are shifted out the other end of shift register 20 into counter 21, which counts the number of leading 1's of each code-word. The $\lceil \log M + 1 \rceil$ bit wide output of counter 21 is supplied to digital comparator 22, which is activated when the counter output reaches M, and to the $\lceil \log M + 1 \rceil$ higher order bits of address register 24. The inverse of the bits shifted out of shift register 20 and the output of comparator 22 are supplied to the inputs of OR-gate 23. When either a 0 bit is supplied to the counter input or M 1's have been counted, a code-word prefix has been detected and OR-gate 23 is activated. The output of OR-gate 23 enables memory 25 and resets counter 21. When memory 25 is enabled it reads out the entry addressed by address register 24, whose high order bits now denote the code-word prefix and whose low order bits contain the remainder of the code-word, into data register 26. Memory 25 is structured like the decoding table of FIG. 3; each entry contains a data-item and the actual remaining length of the code-word for that data-item. When the proper entry is read out into data register 26, the data-item portion is supplied to an output device while the remaining length portion is retained in a section of data register 26 which doubles as a length counter. The length counter section of data register 26 is used (by means not shown here) to shift the correct number of bits out of shift register 20 so that a new code-word may be positioned properly for decoding.

Figure 8:
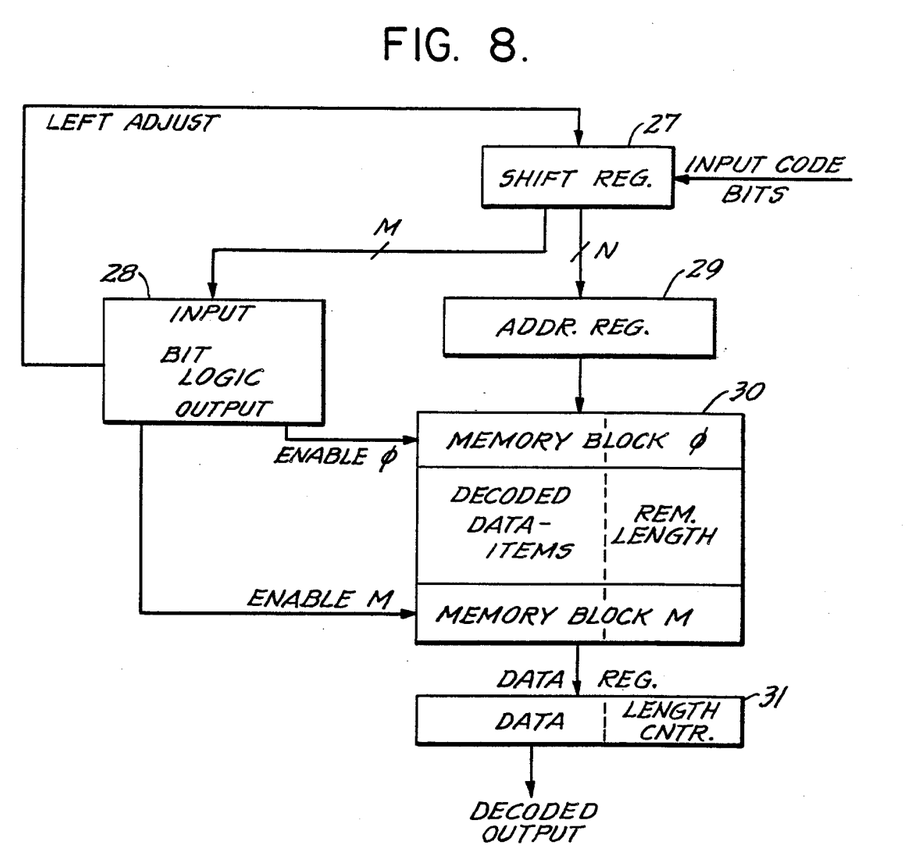
Figure 9:
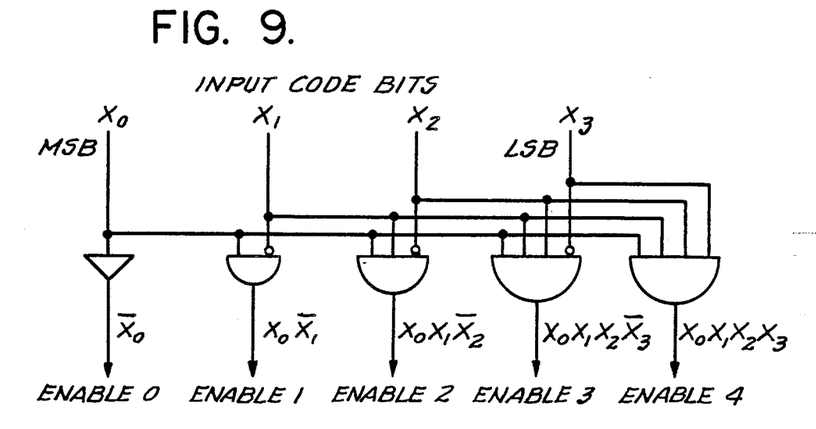
FIG. 9 is a schematic representation of some of the circuitry utilized in the bit logic, of FIGS. 8 and 11, to determine the first 0 but in a code-word.

The hardware embodiment of FIG. 8 is similar in function to that of FIG. 7; the same number of bits are used to index into memory for all prefixes and different code-word lengths are allowed for code-words of the same prefix. However, the decoder of FIG. 8 uses bit logic to detect the first 0 bit in a code-word, and thus determine the prefix. Input code bits enter the right end of shift register 27 which is M (the length of the longest prefix) or N (the length of the longest remainder) bits wide, whichever number is greater. The leading M bits of shift register 27 are supplied to bit logic 28 while the leading N bits are always latched to address register 29. When bit logic 28 determines a code-word prefix, it activates one of the M+1 memory block enable lines and sends a left adjust signal to shift register 27. The left adjust signal causes the shift register to shift its contents left until a 1 bit is shifted out, (similar to the normalization of the mantissa of a floating-point number). The type of logic used in bit logic 28 to detect the first 0 bit is shown in FIG. 9, wherein input code bits $X_0$–$X_3$ are operated upon by simple circuit elements to activate one of 5 enable lines. When one of the enable lines is activated, the corresponding memory block of memory 30 is used to retrieve the entry addressed by address register 29, which at that point contains the remaining part of the code-word, and load said entry into data register 31. The structure of memory 30 is similar to memory 25 of FIG. 7 and to the decoding table of FIG. 3; each entry contains a data-item portion and a remaining length portion. However memory 30 is divided into M+1 memory blocks corresponding to the M+1 prefixes with each block capable of being activated by its own enable line. After the correct entry is loaded into data register 31, the data-item portion is furnished to an output device, while the remaining length portion is used as a length counter to shift the actual code-word remainder out of shift register 27 and thus prepare the decoder for the next code-word.

The decoding embodiments wherein the same number of bits are used to index into memory for all prefixes and code-words of the same prefix are of the same length, are similar in structure to the hardware embodiments of FIGS. 7 and 8. The embodiment that uses a counter to determine the code-word prefix would be similar to FIG. 7 while the one that uses bit logic would be similar to FIG. 8. The only differences between the hardware embodiments where the length of the code-words for any single prefix must be identical and the embodiments of FIGS. 7 and 8, lie in the disposal of the code-word remainder. The former embodiments use a memory that does not have a remaining length field and a data register that does not have a length counter section. Instead of these elements, means are provided to automatically shift N bits (all remainders are N bits wide in this case) out of the shift register after each memory access.

Figure 10:
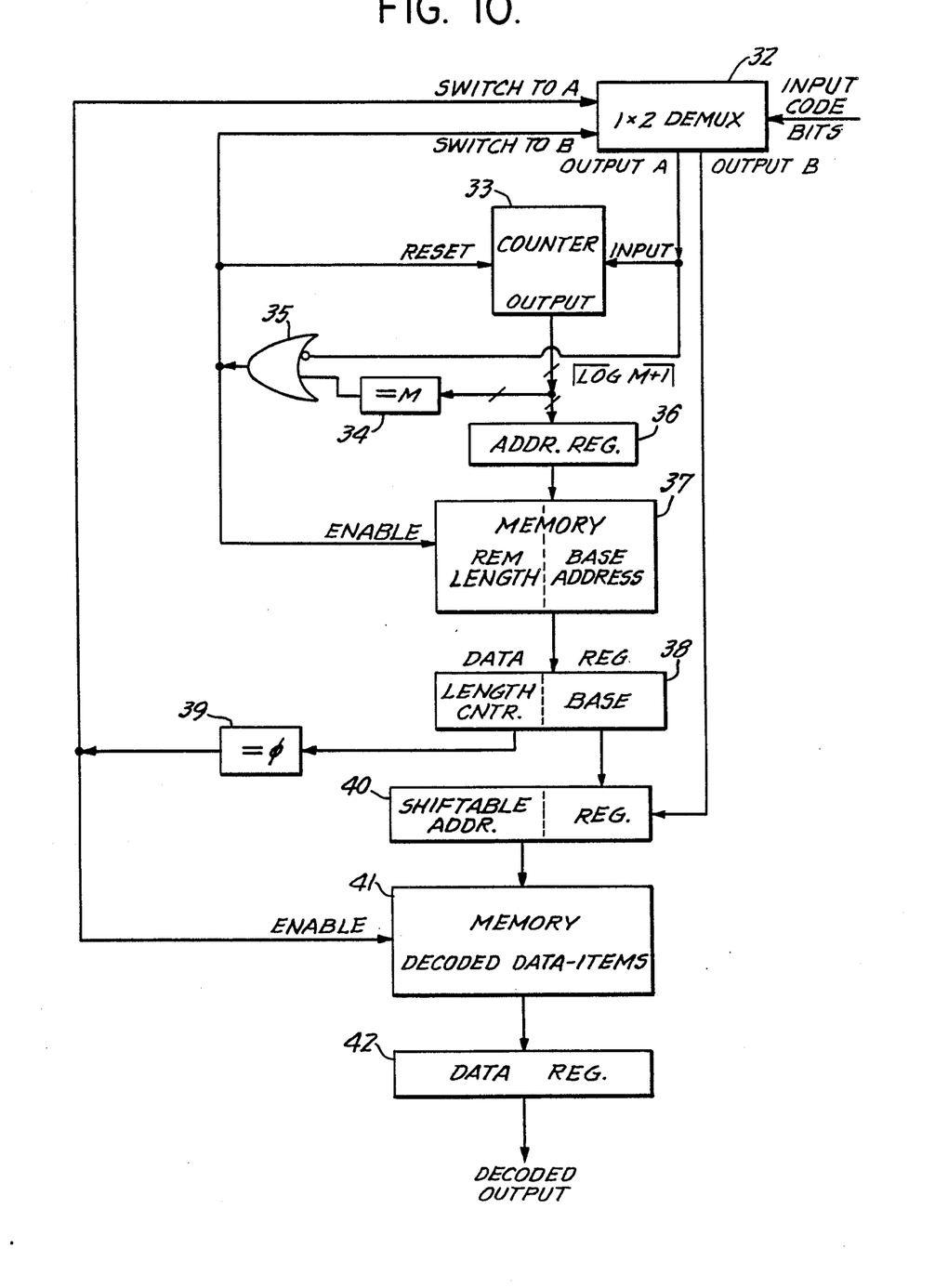

FIG. 10 illustrates the hardware embodiment of the decoding scheme wherein a counter determines the code-word prefix, the number of bits used to index into memory is prefix dependent, and the code-words of any particular prefix are of the same length. Input code bits are supplied to demultiplexer 32 where they are channelled to either of two outputs, output A or output B, depending on the stage of the decoding process. Initially, the input bits are directed by demultiplexer 32 to output A and the input of counter 33, which counts the number of leading 1's of each code-word. The $\lceil \log M+1 \rceil$ bit wide output of counter 33 is supplied to digital comparator 34, which is activated when the counter output reaches M, and to address register 36. The inverse of output A together with the output of comparator 34 are supplied to the inputs of OR-gate 35. When a prefix has been detected, either by a 0 bit appearing at output A or by M 1's being counted, OR-gate 35 is activated and its output then enables memory 37, resets counter 33, and signals demultiplexer 32 to channel the input code bits to output B. When memory 37 is enabled, it reads out the entry addressed by address register 36, whose contents now denote the code-word prefix, into data register 38. Each entry of memory 37, which is structured like the decoding table of FIG. 6A, consists of one field which indicates the base address in main memory 41 of the code-word group whose common prefix corresponds to said entry, and another field which specifies the remaining length of the code-words in said group. When data register 38 is loaded with the proper entry, the base address is further transferred to the low order bits of shiftable address register 40. In addition, the remaining length field is retained in a section of data register 38 that operates as a length counter, so as to shift the code-word remainder from output B onto the base address field contained in said shiftable address register 40. The bits of the length counter in data register 38 are supplied to digital comparator 39 which is activated when the remaining length field in the data register is decremented to zero, indicating that all the remaining code-word bits have been left-shifted into address register 40. The output of comparator 39 enables main memory 41 and signals demultiplexer 32 to redirect the input code bits to output A. When enabled, main memory 41 accesses the data-item addressed by shiftable address register 40, which now contains the code-word remainder appended to the base-address for the code-word's group. Main memory 41 is structured like the decoding table of FIG. 6B; the data-items are grouped by their corresponding code-word prefixes, each code-word group having a size that is a power of 2 and being delineated by their corresponding base-addresses listed in memory 37. The accessed data-item is loaded into data-register 42 and subsequently supplied to an output device. It must be noted that as soon as digital comparator 39 switches the input code bits back to output A, the circuitry can begin decoding the next code-word.

Figure 11:
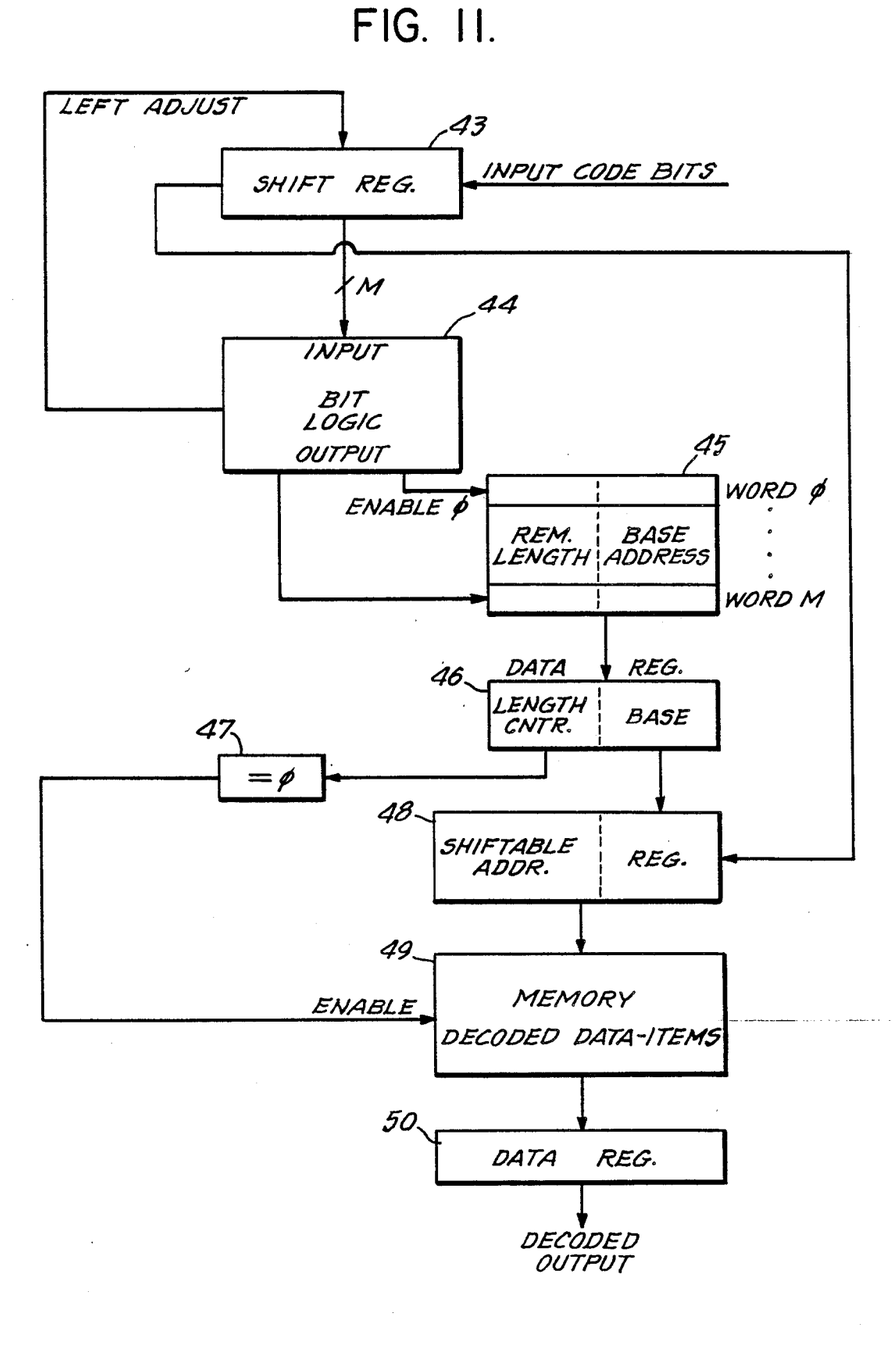

The hardware embodiment of FIG. 11 is similar in function to that of FIG. 10; the number of bits use to index into memory is prefix dependent and code-words of the same prefix are of the same length. However the decoder of FIG. 11 uses bit logic to detect the first 0 bit in a code word, and thus determine the code-word prefix. Input code bits enter the right end of shift register 43 until M bits, which is the width of the register, have been shifted in. All M bits of shift register 43 are supplied to bit logic 44 which determines the code-word prefix using the type of logic illustrated in FIG. 9. When a prefix has been decoded, bit logic 44 activates one the M+1 word enable lines and sends a left adjust signal to shift register 43, which causes the shift register to shift its contents left until a 1 bit is shifted out. When one of the word enable lines is activated, the corresponding word of memory 45 is loaded into data-register 46. The structure of memory 45 is similar to memory 37 of FIG. 10 and to the decoding table of FIG. 6A; each word contains a base address field and a remaining length field. However, each word of memory 45 is enabled by its own enable line. After the correct word is loaded into data-register 46, the base address field is further transferred to the low order bits of shiftable address register 48, while the remaining length field is used as a length counter to shift the code-word remainder from the left end of shift register 43 onto the base address field now contained in said shiftable address register 48. The bits of the length counter in data register 46 are supplied to digital comparator 47 which is activated by a zero input, indicating that all the remaining code-word bits have been left-shifted through shift register 43 and into address register 48. The output of comparator 47 enables main memory 49 to access the data-item addressed by shiftable address register 48, which now contains the code-word remainder appended to the proper base-address, and load said data-item into data register 50 to be subsequently furnished to an output device. Main memory 49 is structured like main memory 41 of FIG. 10 and the decoding table of FIG. 6B; it contains only data-items grouped by their code-word prefixes. Decoding of the next code-word, which has been brought into position in shift register 43, can begin as soon as digital comparator 47 is activated.

The decoding embodiments wherein the number of bits used to index into memory is prefix dependent and different code-word lengths are allowed for code-words of the same prefix, are similar in structure to the hardware embodiments of FIGS. 10 and 11. The embodiment that uses a counter to determine the code-word prefix would be similar to FIG. 10 while the one that uses bit logic would be similar to FIG. 11. The only differences between the hardware embodiments where the code-words of each prefix are not necessarily of the same length and the embodiments of FIGS. 10 and 11, lie in the disposal of the code-word remainder. The former embodiments supply the code-word remainder to the shiftable address register of the main memory without actually removing the code bits from the input stream in the counter embodiment or from the shift register in the bit logic embodiment. Instead, the remaining length field in the first, small memory specifies the longest remainder for the code-words of each prefix while another field is added to the main memory to indicate the actual remaining length of each code-word. Consequently, a length counter section must be added to the data register of the main memory to store the actual remaining length field and remove the code-word remainder from the input bit stream in the counter embodiment or shift the remainder out of the shift register in the bit logic embodiment, for proper positioning of the next code-word. There would be some duplication of entries in the main memory to account for code-words of the same prefix being of different lengths.

There are a few characteristics of the disclosed embodiments that should be noted. No matter the number of data-items used or the length of the longest code-word, the average length of the code-word prefixes would be less than two bits, assuming a dyadic probability distribution, and close to two bits otherwise. In the decoding scheme, it isn't always necessary to have an all 1's prefix, and thus economize on some logic elements. In the decoding embodiments where the number of bits used to index into memory is prefix dependent, the first small memory, having very few entries, may be built with an extremely fast access time at little cost, thus reducing the decoding time. In the decoding embodiments where code-words of the same prefix are of the same length, as soon as the code-word remainder is removed from the input bit stream, decoding of the next code-word may begin; this overlap of decoding operations will also reduce the decoding time. All the decoding embodiments have been illustrated by special-purpose hardware units, whereas the decoding process could also be carried out by a general-purpose computer using programed instructions to duplicate the correct sequence of operations.

While the invention has been particularly shown and described with reference to preferred embodiments thereof, it will be understood by those skilled in the art that various modifications and changes in form and details may be made therein without departing from the spirit and scope of the invention.

I claim:

1. A method for decoding input variable-length code-words wherein each code-word is divided into two parts, a prefix part consisting of the first 0 bit together with all the preceding 1 bits and a remainder part consisting of all the bits following the first 0 bit, whereby fixed-length binary data-symbols corresponding to said input code-words are stored in sections of a decoding table that correspond to the different code-word prefixes, said decoding method comprising the following two steps:

first, determining the position of the first 0 bit in each input code-word and thus the code-word prefix, where said prefix specifies a section in the decoding table; and second, using the input bits following the first 0 bit which include the code-word remainder to specify an address in said decoding table section and thus retrieve the data-symbol corresponding to a given input code-word.

2. The decoding method set forth in claim 1, wherein an additional code-word prefix is designated, said prefix consisting of all 1 bits, and whereby the first step of said decoding method detects this prefix along with the other code-word prefixes when said prefix occurs in said input code-words.

3. The decoding method set forth in claim 1, wherein the number of bits used to specify the address in said decoding table section is the same for all prefixes.

4. The decoding method set forth in claim 1, wherein the number of bits used to specify the address in said decoding table section is not the same for all code-word prefixes, and where said decoding method includes an auxiliary decoding table to specify sections and address lengths of the main data-symbol decoding table, said auxiliary decoding table having entries corresponding to each of the prefixes, in which each auxiliary decoding table entry contains:
- (a) a base address field used to specify the position of a section in the main decoding table containing the data-symbols, and
- (b) a remaining length field used to indicate the number of bits needed to specify the addresses of the data-symbols in said decoding table section.

5. The decoding method set forth in claim 1, wherein the code-words associated with each prefix are of the same length.

6. The decoding method set forth in claim 1, wherein the code-words associated with each prefix are not of the same length, and where each entry in said decoding table contains a remaining length field together with a binary data-symbol to indicate the actual remaining length of the corresponding code-word.

7. Apparatus for decoding input variable-length code-words wherein each code-word has a prefix part consisting of the first 0 bit together with all the preceding 1 bits and a remainder part consisting of all the bits following the first 0 bit, said apparatus comprising:
- (a) a memory where fixed-length binary data-symbols corresponding to said input code-words are stored, having sections therein that correspond to the different code-word prefixes;
- (b) first means responsive to the input code-words for determining the position of the first 0 bit in each input code-word and thus the code-word prefix;
- (c) second means responsive to said position for specifying a section in the memory;
- (d) third means responsive to the input bits following a first 0 bit which include the code-word remainder for specifying an address in a memory section; and
- (e) fourth means for retrieving from the memory the data-symbol stored at the addressed location.

8. Apparatus as set forth in claim 7, wherein an additional code-word prefix is designated, said prefix consisting of all 1 bits, and whereby means for detecting this prefix along with the other code-word prefixes when said prefix occurs in said input code-words, is included in said first means.

9. Apparatus as set forth in claim 7, wherein said first means comprises a counter which counts the number of 1 bits before the first 0 bit in each code-word.

10. Apparatus as set forth in claim 7, wherein said first means comprises bit logic which operates directly on a number of input bits, equal to the length of the longest prefix, to detect the first 0 bit in each code-word.

11. Apparatus as set forth in claim 7, wherein the number of bits used by said third means to specify an address in a memory section is not the same for all code-word prefixes, and where said apparatus further includes another memory, having entries corresponding to each of the prefixes, in which each entry contains:
- (a) a base address field used by said second means to specify the position of a section in the memory containing the data-symbols, and
- (b) a remaining length field used to indicate the number of bits needed by said third means to specify the addresses of the data-items in said section.

12. Apparatus as set forth in claim 7, wherein the code-words associated with each prefix are not of the same length, whereby each entry in said memory contains a remaining length field together with a binary data-symbol to indicate the actual remaining length of the corresponding code-word, and where said fourth means retrieves from said memory both said remaining length field together with said data-item.

13. A process for effecting conversions between variable-length and fixed-length codes comprising the following steps:
- (a) representing encodable items of information by variable-length code-words of such nature that the code-words can be divided into a variable-length prefix part consisting of a series of 1 bits terminated by a single 0 bit and a remainder part, whose lengths are equal or nearly equal to each other for the same prefix consisting of the remaining bits of the code-word;
- (b) ascertaining the prefix of the present code-word by detecting the position of the first 0 bit in the code-word;
- (c) registering the bits following the first 0 bit which include a code-word remainder; and
- (d) combining said bits with information denoting said prefix to address and retrieve the fixed-length representation of the present code-word from a decoding table.

* * * * *